United States Patent
Park et al.

(10) Patent No.: US 7,012,443 B2
(45) Date of Patent: Mar. 14, 2006

(54) SYSTEM USED TO TEST PLURALITY OF DUTS IN PARALLEL AND METHOD THEREOF

(75) Inventors: Woo-Ik Park, Chungcheongnam-do (KR); Yong-Woon Kim, Chungcheongnam-do (KR); Young-Gu Shin, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 22 days.

(21) Appl. No.: 10/779,178

(22) Filed: Feb. 12, 2004

(65) Prior Publication Data

US 2004/0239361 A1    Dec. 2, 2004

(30) Foreign Application Priority Data

May 26, 2003    (KR)    ............... 10-2003-33348

(51) Int. Cl.
G01R 31/26    (2006.01)

(52) U.S. Cl. ........................ 324/764; 324/765
(58) Field of Classification Search .......... 324/73.1, 324/763–765, 158.1; 714/724–726, 733–734; 438/14, 17
See application file for complete search history.

(56) References Cited

U.S. PATENT DOCUMENTS

| | | | | |
|---|---|---|---|---|
| 4,244,048 A | * | 1/1981 | Tsui | ............ 714/726 |
| 4,947,357 A | * | 8/1990 | Stewart et al. | ............ 714/726 |
| 5,623,202 A | * | 4/1997 | Yung | ............ 324/158.1 |
| 5,796,246 A | * | 8/1998 | Poh et al. | ............ 324/73.1 |
| 5,994,912 A | * | 11/1999 | Whetsel | ............ 324/763 |
| 6,483,758 B1 | * | 11/2002 | Kim et al. | ............ 365/201 |

FOREIGN PATENT DOCUMENTS

JP    2001-176293    6/2001

OTHER PUBLICATIONS

English language of Abstract from Japanese Patent Publication No. 2001-176293.

* cited by examiner

*Primary Examiner*—Minh N. Tang
(74) *Attorney, Agent, or Firm*—Marger Johnson & McCollom, P.C.

(57) ABSTRACT

Provided is a system and method of testing a plurality of devices under test (DUTs) in parallel. The method includes preparing at least two DUTs having input/output signal pins connected in common to one input/output signal channel and having chip selection signal pins connected to a chip selection signal channel, which provides a chip selection signal to specify one output data among output data to be outputted through the commonly connected input/output channel. The method includes reading the outputted data specified by the chip selection signal through the commonly connected input/output signal channel from one of the devices under test selected by the chip selection signal.

26 Claims, 6 Drawing Sheets

SYSTEM USED TO TEST PLURALITY OF DUTS IN PARALLEL AND METHOD THEREOF

This application claims the priority of Korean Patent Application No. 2003-33348, filed on May 26, 2003, in the Korean Intellectual Property Office, the disclosure of which is incorporated herein in its entirety by reference.

BACKGROUND OF THE INVENTION

1. Field of the Invention

The present invention relates to a system used to electrically test integrated circuit devices, and more particularly, to a system used to test integrated circuit devices and a method used by such a system. The devices being tested are referred to devices under test (DUTs).

2. Description of the Related Art

After they have been packaged, and before they are sold, integrated circuit devices, such as Double Data Rate Memories (DDRs) and Synchronous Dynamic Random Access Memories (SDRAMs) are electrically tested. Since the time taken to run the tests is reflected in a product's cost, many attempts have been made to reduce test time.

Generally in order to reduce test time, one piece of equipment simultaneously tests a plurality of DUTs. However, due to structural limitations, only a limited number of channels are provided in the most test equipment. Thus, in general one piece of test equipment can test only a limited number of DUTs.

To overcome this limitation, many attempts have been made to reduce the number of channels required to test DUTs. One way of reducing the number of channels is to connect a plurality of DUTs in parallel to a piece of test equipment and to connect the pins of the DUTs in common. For example, Japanese Patent Laid-open Publication No. 2001-176293 (published on Jun. 29, 2001) discloses a method of testing DUTs using common connections.

Various methods of reducing the number of channels by commonly connected pins have been considered. However, it is very difficult to commonly connect the input/output pins within DUTs. In general the data output signals must be unique, hence, it is generally impossible to commonly connect the input/output pins of the same kinds of DUTs. That is to say, input/output channels are generally connected to input/output pins of DUTs in a one-to-one manner. For example, if a DUT is a ×8 product, eight input/output channels are generally required for one DUT. Accordingly, the number of input/output channels must generally be eight times as many as the number of DUTs which are simultaneously tested.

Since the number of channels required in a test equipment is limited, the number of DUTs which can be simultaneously tested is also limited. Hence, there is a need for a method to simultaneously test more DUTs using a limited number of channels.

Furthermore it is very difficult to adjust the test equipment to the DUTs on case by case basis. Thus, a method of testing a plurality of devices at a same time, which has more test variables is needed.

SUMMARY OF THE INVENTION

The present invention provides a system and method which can simultaneously test a large number of DUTs while using a limited number of channels.

According to one aspect of the present invention, there is provided a system which tests a plurality of DUTs in parallel. The system comprises: a plurality of DUTs; a plurality of input/output signal channels connected in common to input/output signal pins of the DUTs; a plurality of chip selection signal channels which provide chip selection signals to the DUTs to specify one output data among output data to be output through the commonly connected input/output signal channels; and test equipment which tests the DUTs through the input/output signal channels and the chip selection signal channels.

One of the input/output pins may be directly connected to the input/output signal channel and other input/output pin may be shorted to the directly connected pin. The directly connected pin and the pin shorted with the directly connected pin may be individually included in different DUTs.

The number of input/output signal channels may be less than or equal to half the number of input/output signal pins of one DUT.

The test system may further include a DC channel connected in common to an inverted clock signal and a reference voltage pin of the DUTs. The DC channels may be connected in common to inverted clock signal pins and reference voltage pins of the DUTs, which in turn are connected in common to the input/output signal channels.

The number of the chip selection channels may be dependent on the number DUTs which are connected in common to the input/output signal channels.

The system may further comprise second DUTs which are connected in common to the chip selection channels but not connected in common to the commonly connected input/output signal channels.

According to another aspect of the present invention, there is provided a method of testing a plurality of DUTs. The method comprises: preparing at least two DUTs having input/output signal pins connected in common to an input/output signal channel and having chip selection signal pins connected to respective chip selection signal channels, which provide chip selection signals used to select output data from one of the devices under test; and reading through the commonly connected input/output signal channel the output data from the DUTs selected by the chip selection signal.

The preparation step may include directly connecting one of the input/output signal pins to the input/output signal channel and shortening the other pin with the directly connected pin. The directly connected pin and the shorted pin may be individually included in different DUTs.

The preparation step may further include commonly connecting a DC channel which supplies DC current to inverted clock signal pins and reference voltage pins of the DUTs. The method may further comprise introducing second DUTs which are connected in common to the chip selection signal channel but not connected in common to the commonly connected input/output signal channel.

The reading step may include reading via an input/output signal channel that is different from the commonly connected input/output signal channel.

The method may further comprise commonly performing a write operation at the DUTs, before the reading step.

With the present invention, a large number of integrated circuit DUTs can be simultaneously tested although a limited number of channels provided in the test equipment being used. Therefore, test efficiency can be considerably improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown.

The present invention provides a system and method which can simultaneously test a plurality of DUTs, which have high capacity and thus need a large number of test variables, using a limited number of channels in the test equipment being used.

To overcome the limitations in the number of channels required, a preferred embodiment of the present invention provides a method of connecting the input/output pins of two or more DUTs to one specific input/output channel in common. Accordingly, the number of channels required is less than or equal to half the number of input/output pins of the DUTs.

Since the output data of two DUTs are outputed together through the commonly connected input/output pins, a chip selection (CS) signal is used to specify which of the DUT's data is to be read. That is to say, unique output data can be selectively read by selecting one of the output data signals using the CS signal.

Furthermore, to reduce the number of required channels, the preferred embodiment of the present invention commonly connects, to one channel, an inverted clock signal CLKB pin of the DUT and a reference voltage VREF signal pin of the DUT for DC current. That is to say, in the preferred embodiment of the present invention a CLKB signal is used as a VREF signal.

The CLKB signal is used as an inverted signal of a clock CLK signal, and the crossing points between the CLK signals and the CLKB signals are reference points for timing in operating the DUT. In the present invention, although a CLKB signal is the same type of signal as a VREF signal, the level crossing points between the CLK signal and the CLKB signal can be used as reference points for timing. As a result, one spare channel is secured by connecting the CLKB signal pin and the VREF signal pin of a DUT in common.

Figure 1:
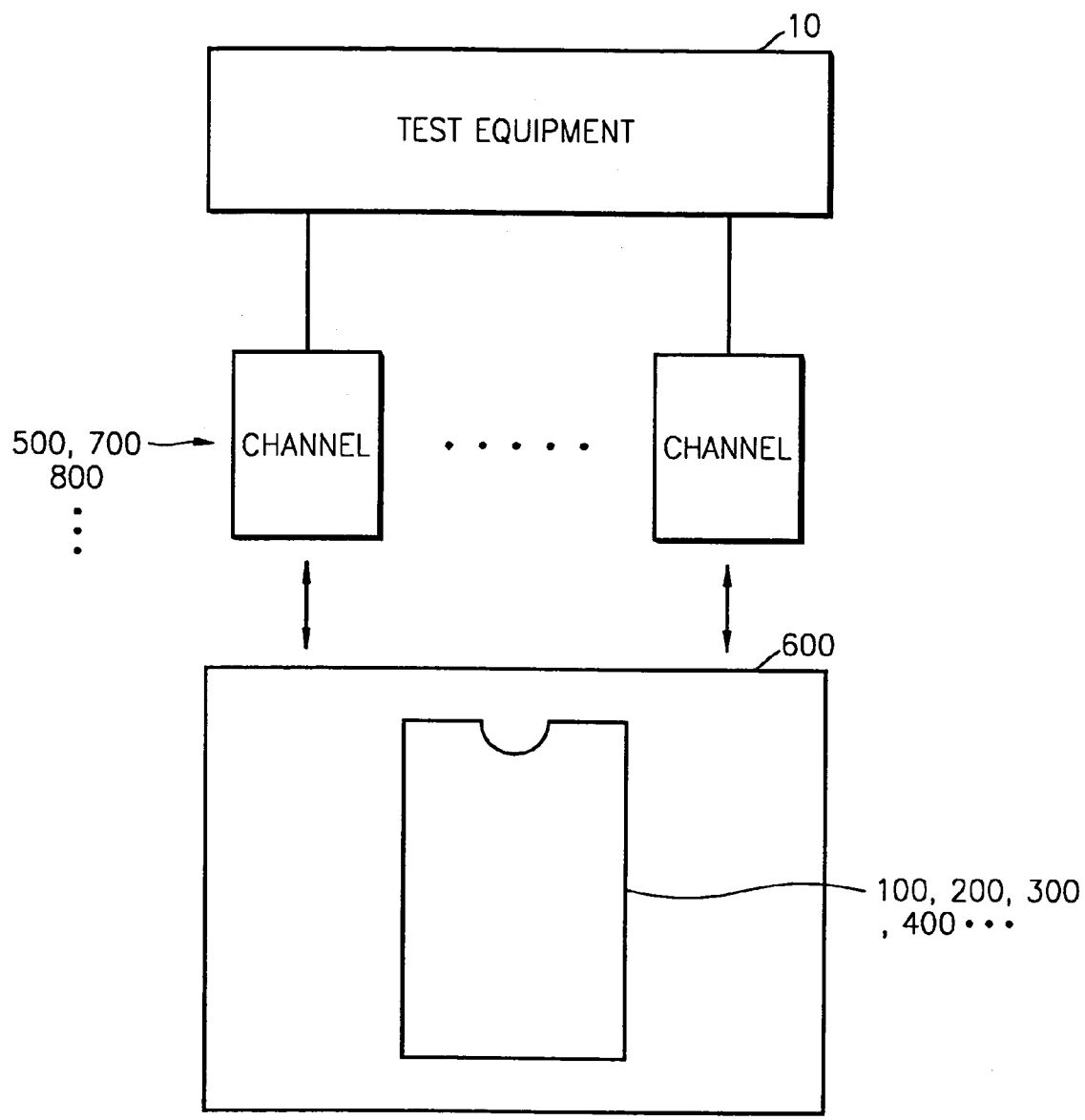
FIG. 1 is a schematic block diagram of a typical test system.
Figure 2:
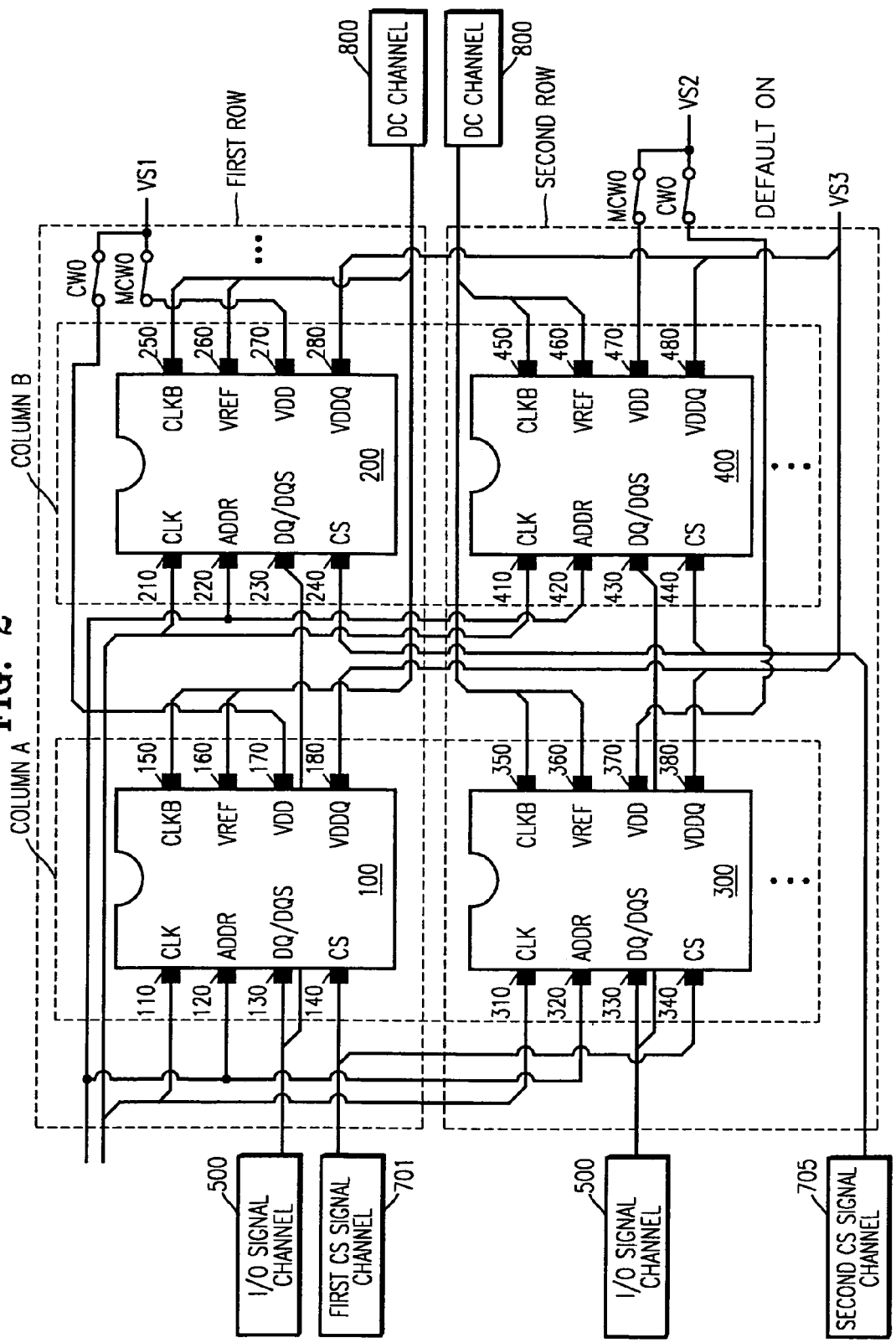
FIG. 2 is a schematic circuit diagram for explaining a test system and method according to a preferred embodiment of the present invention.
Figure 3:
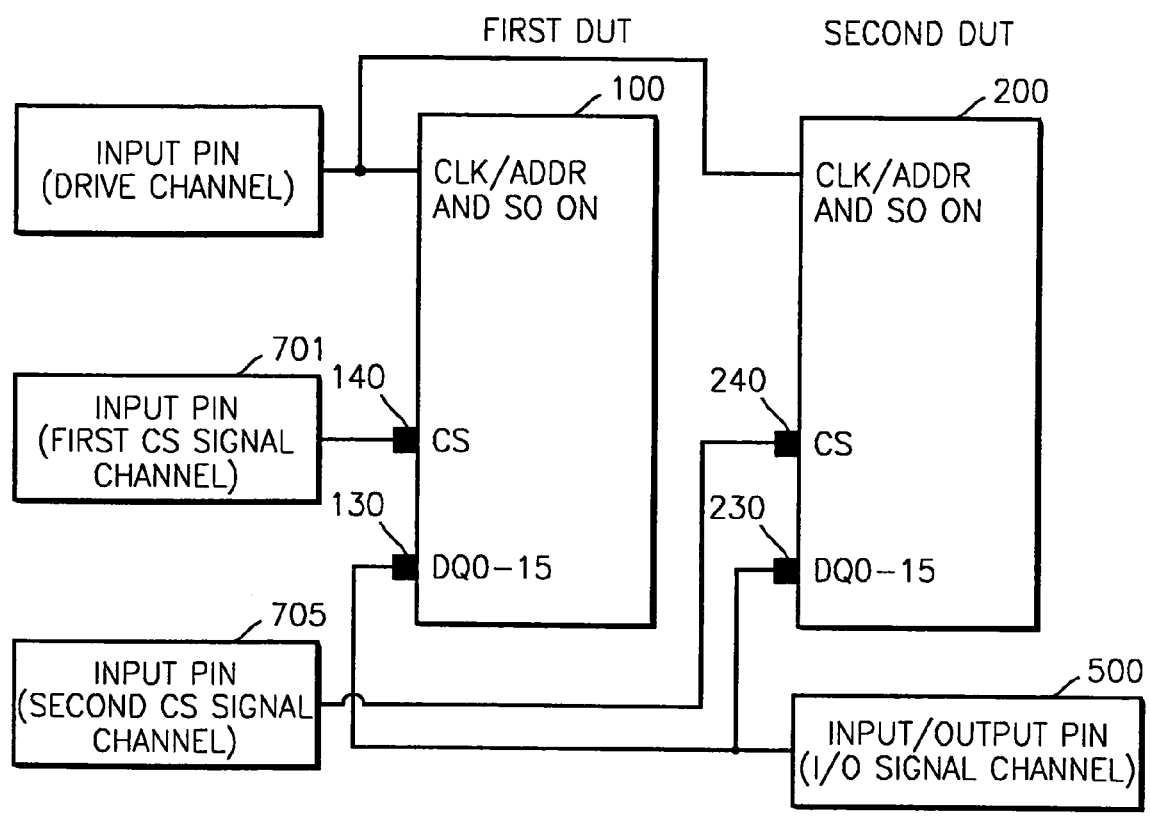
FIG. 3 is a schematic block diagram for explaining how to commonly connect the input/output pins of two DUTs of FIG. 2.
Figure 4:
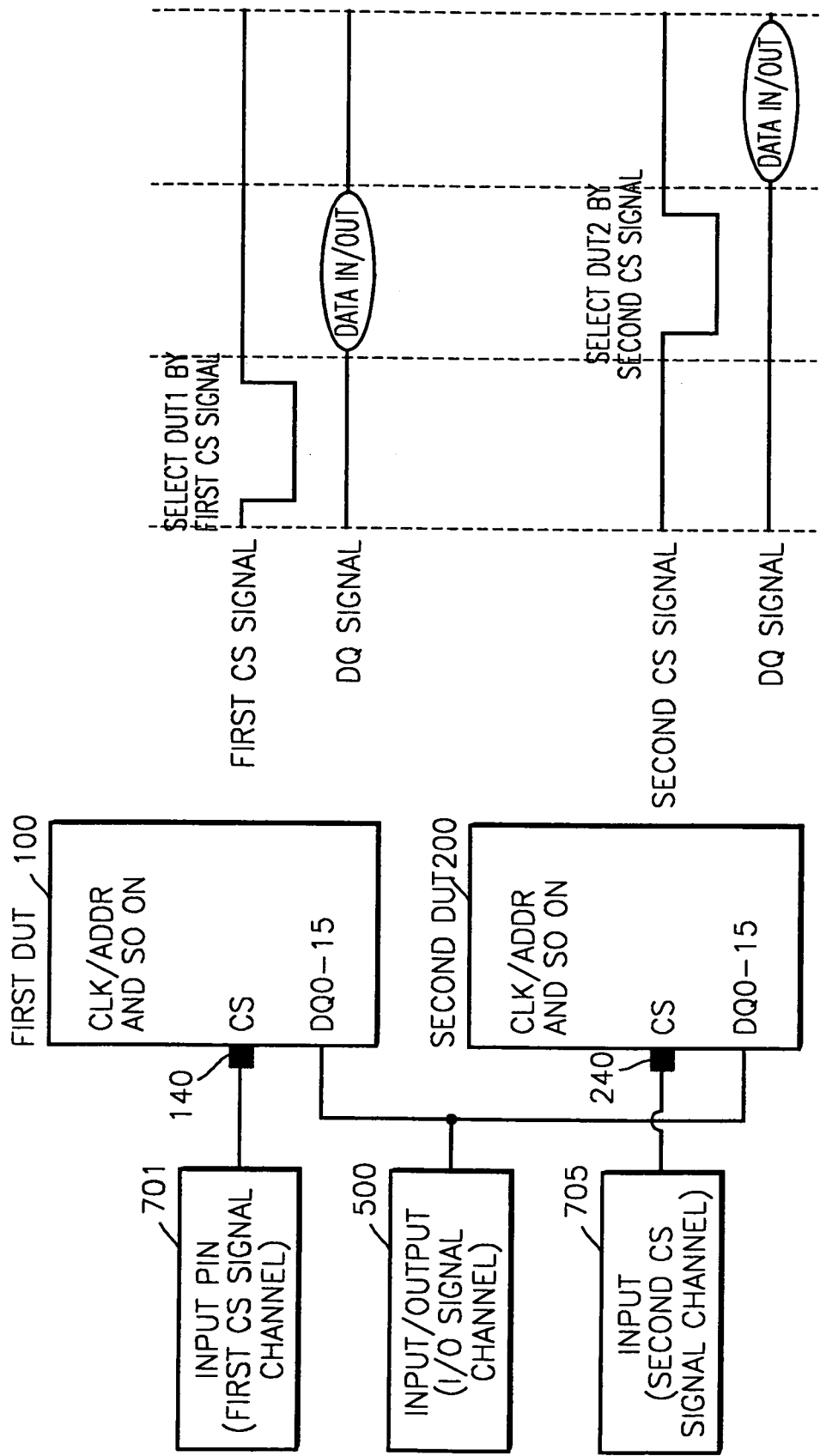
FIG. 4 is a schematic timing diagram for explaining how to read output data using a chip selection signal according to a preferred embodiment of the present invention.
Figure 5A:
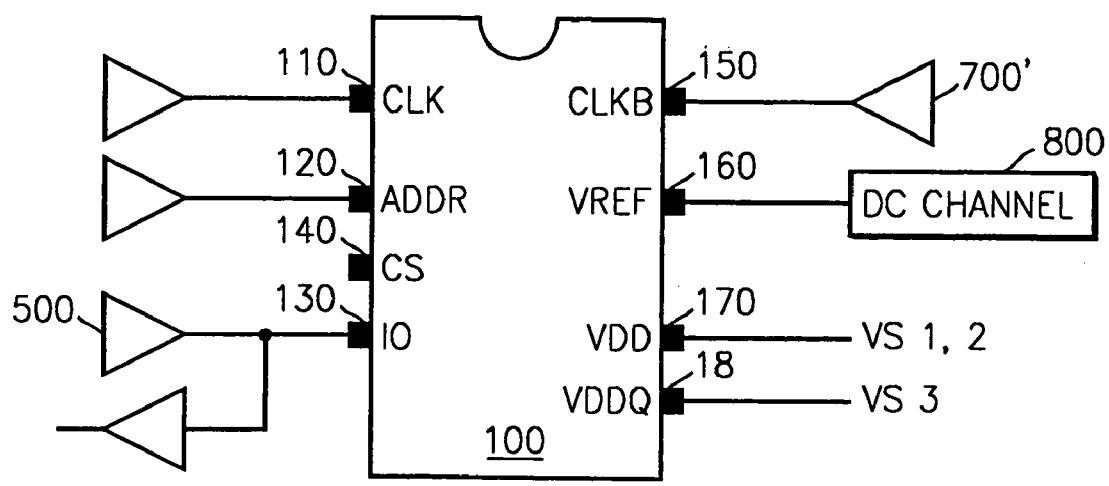
FIGS. 5A and 5B are schematic circuit diagrams for explaining how to connect a channel for providing the chip selection signal according to the preferred embodiment of the present invention.
Figure 5B:
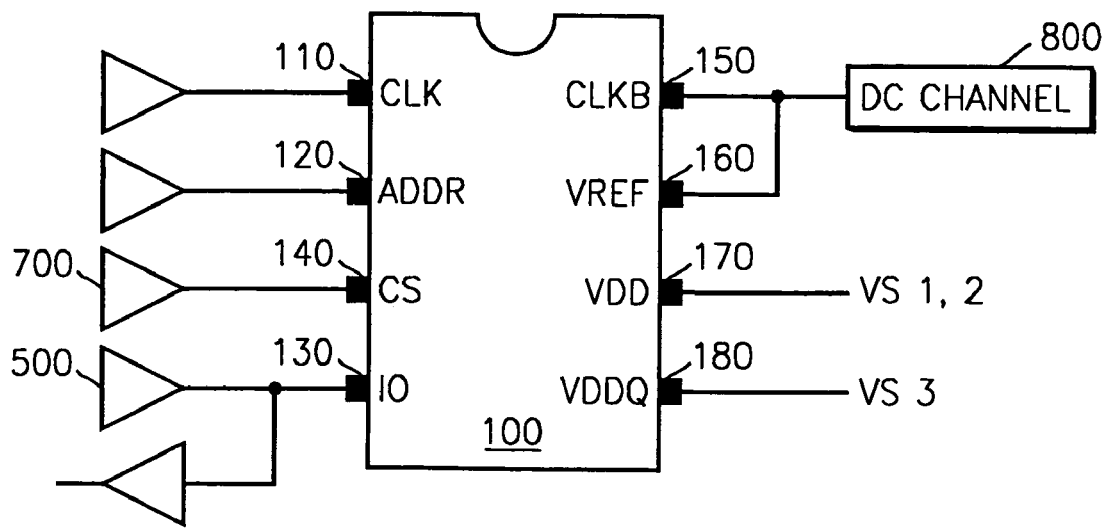
Figure 6A:
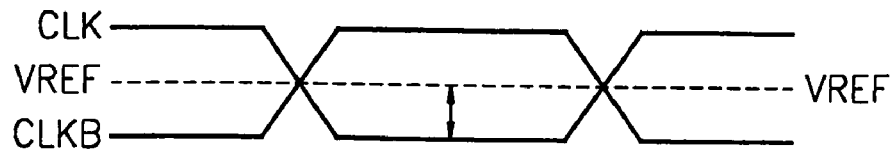
FIGS. 6A and 6B are schematic timing diagrams for explaining signal types realized by clock signals and inverted signals according to the preferred embodiment of the present invention.
Figure 6B:
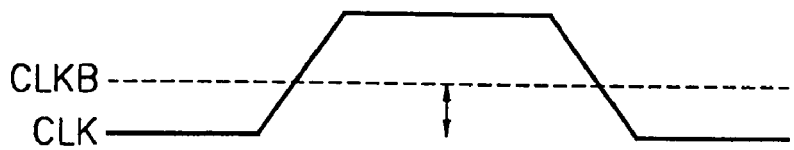
Figure 7:
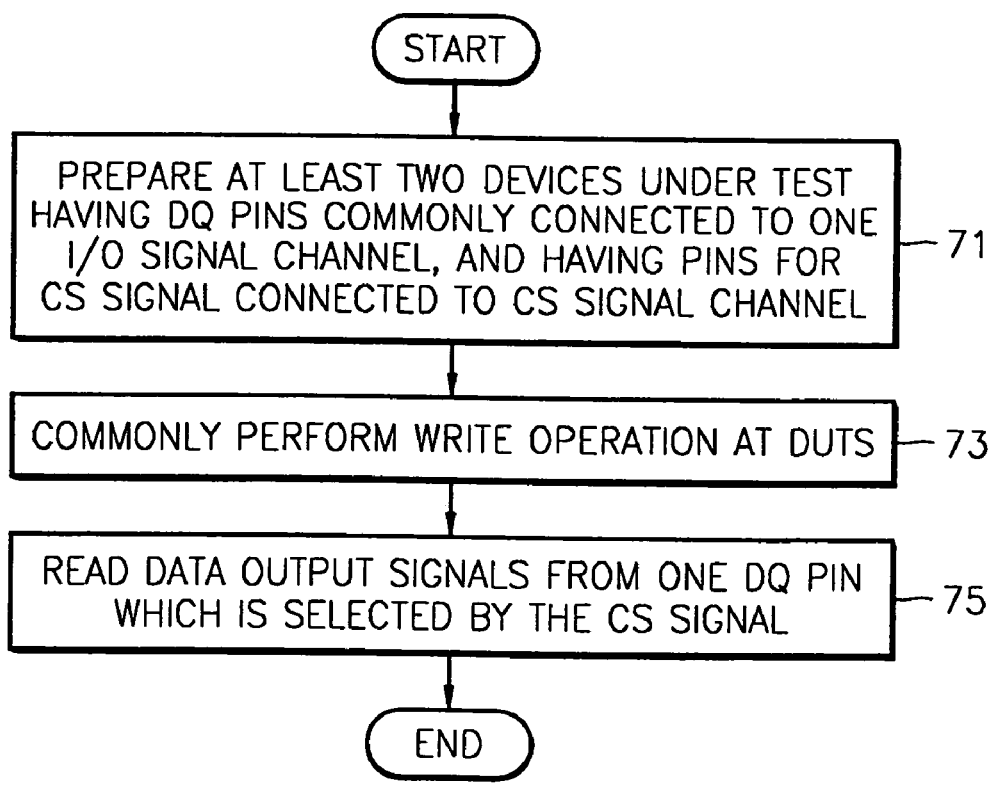
FIG. 7 is a schematic flow chart for explaining a test method according to the preferred embodiment of the present invention.

FIG. 1 is a schematic block diagram of a typical test system. FIG. 2 is a schematic circuit diagram for explaining a test system and method according to a preferred embodiment of the present invention. FIG. 3 is a schematic block diagram for explaining how to connect input/output pins of two DUTs of FIG. 2 in common. FIG. 4 is a schematic timing diagram explaining how to read output data in synchronization with a CS signal according to the preferred embodiment of the present invention. FIGS. 5A and 5B are schematic circuit diagrams explaining how to connect a channel to provide a chip selection signal according to the preferred embodiment of the present invention. FIGS. 6A and 6B are schematic timing diagrams explaining signal types realized by a CLK signal and a CLKB signal according to the preferred embodiment of the present invention. FIG. 7 is a schematic flow chart explaining a test method according to the preferred embodiment of the present invention.

Referring to FIG. 1, test equipment 10 is electrically connected to first through fourth DUTs 100, 200, 300, and 400 by channels 500, 700, and 800 to test the first through fourth DUTs 100, 200, 300, and 400. The DUTs 100, 200, 300, 400 (and possibly more DUTs) are mounted on a socket board 600 or an interface board.

Referring to FIG. 2, specific pins of the DUTs 100, 200, 300, and 400 are connected in common to specific channels of the typical test equipment. For example, the first through fourth DUTs 100, 200, 300, and 400 are disposed lengthwise and crosswise. Specific input/output pins or control pins are connected in common between the DUTs to one another and to specific channels.

For example, a first pin 110 of the first DUT 100, which is positioned in a first row, column A and a first pin 210 of the second DUT 200, which is positioned in the first row, column B, a first pin 310 of the third DUT 300, which is positioned in a second row, column A, and a first pin 410 of the fourth DUT 400, which is positioned in the second row, column B, are connected in common to one another to provide a CLK signal to the DUTs. The first pins can be connected in common to one drive channel. It should be apparent to those skilled in the art that additional DUTs can be connected in the same manner. Furthermore, second pins 120, 220, 320, and 420 of the DUTs 100, 200, 300, and 400 for address ADDR signals can be connected in common to one channel.

Data input/output DQ pins for data input/output DQ/DQS of two adjacent DUTs in the same row may be either connected in common or shorted together. That is to say, a third pin 130 for input/output of the first DUT 100 may be connected in common to a third pin 230 of the second DUT 200, and a third pin 330 of the third DUT 300 is connected in common to a third pin 430 of the fourth DUT 400. In this manner, two neighbouring DUTs 100 and 200, or 300 and 400 commonly use I/O signal channels 500, so that the number of I/O signal channels 500 required is actually reduced to a half.

When the DUTs 100, 200, 300, and 400 are ×16 products, there are 16 DQ pins per DUT. Accordingly, if the DQ pins are not connected in common or shorted together, 16 I/O signal channels 500 per DUT are required. As described above, if the DQ pins are connected in common, the number of required I/O signal channels 500 can be reduced in proportion to the number of commonly connected DUTs. It is noted that output data output from the DQ pins must be specified. The way this is done is explained in detail below.

Input/output pins of two adjacent DUTs in the same column are not connected in common. For example, the third pin 130 for input/output of the first DUT 100 is independent from the third pin 330 of the third DUT 300, and the third pin 230 of the second DUT 200 is independent from the third pin 430 of the fourth DUT 400. Accordingly, an I/O signal channel 500, which is connected in common to the third pin 130 of the first DUT 100 and the third pin 230 of the second DUT 200, is different from an I/O signal channel 500, which is connected in common to the third pin 330 of the third DUT 300 and the third pin 430 of the fourth DUT 400.

The DQ pins of the two horizontally neighboring DUTs 100 and 200, or 300 and 400 are connected in common to one channel, for example, one input/output I/O signal channel 500, as shown in FIG. 3. Accordingly, it is preferable that the third pins 130, 230, 330, and 430 shown in FIG. 2 represent individually input/output pins required in the respective DUTs 100, 200, 300, and 400.

Referring to FIGS. 2 and 3, the input/output DQ pins, that is, the third pins 130 and 230, of the neighbouring first and second DUTs 100 and 200 are connected in common to one I/O signal channel 500. In this manner, since the two DQ pins 130 and 230 commonly use one I/O signal channel 500, the total number of I/O signal channels 500 required is reduced to a half. This means that more DUTs can be simultaneously tested.

The third pin 130 for input/output of the first DUT 100 and the third pin 230 for input/output of the second DUT 200 can be connected in common by connecting a conducting wire 605 or introducing an additional circuit board within the socket board 600 or the interface board on which the first DUT 100 and the second DUT 200 are mounted to be tested.

When the third pins 130 and 230 for data input/output are connected in common in pairs or shorted together, two output data values output from the third pins 130 and 230 are simultaneously present. For testing, the two signals must be separated and specified. Since a chip selection CS signal selects a chip, namely, a DUT, the third pins 130 and the 230, which are connected in common, can be specified.

Therefore, a first CS signal channel 701 for providing a first CS signal is connected to a fourth pin 140 of the first DUT 100, and a second CS signal channel 705, which is independent from the first CS signal channel 701, is connected to a fourth pin 240 of the second DUT 200. The first CS signal channel 701 and the second CS signal channel 705 function to provide the first and second CS signals for selecting one of the first DUT 100 and the second DUT 200, which commonly use the input/output signal channel 500.

Referring to FIG. 4, signals from the first DUT 100 and the second DUT 200 are simultaneously outputted through the same I/O signal channel 500. Accordingly, to specify one signal, one of the two signals must be blocked and the other one should be activated. This can be carried out by the first and second CS signals provided via the CS signal channels 701 and 705, which are respectively connected to the fourth pins 140 and 240 of the pertinent DUTs. That is to say, as shown in FIG. 4, one signal is blocked by the CS signal which is for selection of a chip or a DUT.

The remaining signal (other than one signal selected by the CS signal) is in a high impedance state (Hi-Z state). As shown in FIG. 4, data from the first DUT 100 and the second DUT 200 is selected by the CS signal, and thus, outputted as a unique output signal.

Referring to FIG. 2 again, each of the CS signal channels 701 and 705 can be connected in common to DUTs that are not connected in common to one I/O signal channel 500. In FIG. 2, the fourth pin 140 of the first DUT 100 and the fourth pin 340 of the third DUT 300 can be connected in common to the same first CS signal channel 701. Furthermore, the fourth pin 240 of the second DUT 200 and the fourth pin 440 of the fourth DUT 400 can be connected in common to the same second CS signal channel 705.

Although the first DUT 100 and the third DUT 300 are connected in common to the first CS signal channel 701, the third pins 130 and 330 for input/output of the first DUT 100 and the third DUT 300, respectively, are connected to different I/O signal channels 500. Accordingly, output signals are not redundant, such that the output signals of each DUT are outputted via their own I/O signal channel 500. This means that a plurality of DUTs can be connected in common to one CS signal channel 701 or 705.

Meanwhile, when the CS signal channel 701 or 705 is introduced, the number of channels required for testing increases.

Referring to FIG. 5A, a channel 700' connected to a fifth pin 150 for CLKB signals is diverted to be used as a CS signal channel 700, so as to compensate the increase in the number of the required channels.

In a typical DDR SDRAM device, CLKB signals, which are inverted signals of CLK signals, use level crossing points between the CLK signals and the CLKB signals as reference points for timing in order to input/output data. Here, although the CLKB signals are the same type as VREF signals, the level cross point between the CLK signals and the CLKB signals can be used as a reference point for timing. Thus, as shown in FIG. 5B, the fifth pin 150 of the DUT 100 for providing the CLKB signals and a sixth pin 160 of the DUT 100 for providing reference voltage VREF signals, which can be used as a reference of CLK signals, are connected in common to the same channel, for example, a DC channel 800 for providing DC current. That is to say, the CLKB signals and the VREF signals are provided in the same way. In this manner, the channel 700' connected to the fifth pin 150 for CLKB signals is remained as a spare channel.

Referring to FIGS. 6A and 6B, as described in FIG. 5A, when the CLKB signal is independent from the CLK signal, a timing diagram as shown in FGI. 6A is formed. Here, since level crossing points between the CLK signals and the CLKB signals are detected, the DDR SDRAM device may operate. As shown in FIG. 5B, when the CLKB signals and the VREF signals are connected in common, a timing diagram as shown in FIG. 6B is formed. Here, the level crossing points between the CLK signals and the CLKB signals is detected at the same time position where the level crossing points between the CLK signals and the CLKB signals are detected in a case where the independent CLKB signal is provided as described in FIG. 6A. Thus, whether or not the CLKB signals and the VREF signals are connected in common does not affect the operation of the DDR SDRAM device, which is a DUT.

Referring to FIG. 2 again, the DC channel 800 is connected in common to the fifth pin 150 for CLKB signals and the sixth pin 160 for VREF signals within the first DUT 100, and also can be connected in common to a fifth pin 250 for CLKB signals and a sixth pin 260 for VREF signals within the second DUT 200. Here, it is preferable that the first DUT 100 and the second DUT 200 use common I/O signal channels 500. In the same manner, fifth pins 350 and 450 for CLKB signals and sixth pins 360 and 460 for VREF signals within the third DUT 300 and the fourth DUT 400, which use common I/O signal channels 500, can be connected in common to the same DC channel 800.

In the meantime, a channel for first voltage for selection VS1 is connected to a seventh pin 170 for VDD of the first DUT 100. Furthermore, a channel for second voltage for selection VS2 is connected to a seventh pin 370 for VDD of the third DUT 300. Here, the first DUT 100 and the third DUT 300 do not commonly use one I/O signal channel 500. The channel for VS1 is also connected to a seventh pin 270 for VDD of the second DUT 200, which commonly uses one I/O signal channel 500 with the first DUT 100. However, the channel for VS1 is connected to the seventh pin 170 of the first DUT 100 in a switching relationship. This is the same as a seventh pin 470 of the fourth DUT 400 is connected to the channel for VS2. Here, VS1 and VS2 are respectively provided in a default on-state to the seventh pin 170 of the first DUT 100 and the seventh pin 370 of the third DUT 300. A channel for third voltage for selection VS3 is connected in common to eighth pins 180, 280, 380, and 480 of the DUTs 100, 200, 300, and 400 for VDDQ.

Referring to FIG. 7, in a test method according to a preferred embodiment of the present invention, a test preparation is first made at step 71. As explained with reference to FIGS. 2 and 3, the third pins 130, which are the DQ pins of the first DUT 100, and the third pins 230, which are the DQ pins of the adjacent second DUT 200, are connected to I/O signal channels 500 corresponding in number to half the number of third pins 130 or 230. Here, a smaller number of I/O signal channels 500 can be used by expanding the principle of the present invention. The third pins 130 and 230 are connected in common to or shorted from the I/O signal channel 500 as shown in FIG. 3. The CS signal channels are respectively connected to the fourth pin 140 of the first DUT 100 and the fourth pin 240 of the second DUT 200 to provide CS signals to the first DUT 100 and the second DUT 200.

Here, the third DUT 300 and the fourth DUT 400 can be introduced as shown in FIG. 2 so as to commonly use the CS signal channel 701 or 705. In this case, it is obvious that the number of I/O channels required for testing the DUTs 100, 200, 300, and 400 is further reduced.

Next, a write operation is performed at the DUTs 100, 200, 300, and 400 at step 73 of FIG. 7. Here, the write operation can be simultaneously performed in the four DUTs 100, 200, 300, and 400. This is because the DUTs do not need to be individually specified in writing.

Next, an operation of reading unique output data specified from one or two DUTs, which are selected by the CS signals is performed at step 75. The specification of output data signals from the DQ pins connected in common, by the CS signals can be performed as described above with reference to FIG. 4. When the two DUTs 100 and 300, or 200 and 400 are connected in common to one CS signal channel 701 or 705, a read operation can be simultaneously performed in two DUTs 100 and 300, or 200 and 400.

As described above, while a limited number of channels of the test equipment are used as usual, a greater number of DUTs can be simultaneously tested. Since the number of required I/O signal channels can be reduced by commonly connecting or shorting the DQ pins, the number of DUTs, which can be simultaneously tested, is increased.

Furthermore, output data redundancy due to common connection of the DQ pins can be overcome by providing CS signals and using the CS signals in the specification of output data during a read operation of the outputted data. Here, a drive channel, which is secured by commonly connecting CLKB signals and VREF signals, is used as a CS signal channel for providing the CS signals, so that the increase in the number of actually required channels due to the CS signal channel introduction is prevented.

In addition, an additional function to specify redundant output data which is caused by the common connection of the DQ pins does not need to be applied to the device by virtue of the CS signal channel. Thus, the test can be widely used for general purposes.

While the present invention has been explained with respect to an example where ×16 products are tested, the present invention can be applied to other products, such as ×4 products and ×8 products. Additionally, while the two DQ pins are connected in common or shorted together in the embodiment described herein, it is also possible that a greater number of DQ pins can be connected in common or shorted together.

While the present invention has been particularly shown and described with reference to exemplary embodiments thereof, it will be understood by those of ordinary skill in the art that various changes in form and details may be made therein without departing from the spirit and scope of the present invention as specified by the following claims.

What is claimed is:

1. A system which tests a plurality of devices in parallel, the system comprising:
    a plurality of devices under test, said devices arranged in rows and columns;
    a plurality of input/output signal channels connected in common to input/output signal pins of the devices under test, all input/output signal pins of devices in each row being connect to the same input/output signal channel,
    a plurality of chip selection signal channels which provide chip selection signals to the devices under test to specify one output data among output data to be output through the commonly connected input/output signal channels, each chip selection signal channel being connected to all the devices under test in one column;
    a DC channel connected in common with an inverted clock signal pin and a reference voltage pin of the devices under test; and
    test equipment which tests the devices under test through the input/output signal channels and the chip selection signal channels.

2. The system of claim 1, wherein the devices under test are memory devices.

3. The system of claim 1, wherein one of the input/output pins is directly connected to the input/output signal channel and other input/output pin is shorted with the directly connected pin.

4. The system of claim 3, wherein the directly connected pin and the pin shorted with the directly connected pin are individually included in different devices under test.

5. The system of claim 1, wherein the number of input/output signal channels is less than or equal to half the number of input/output signal pins of one device under test.

6. The system of claim 1, wherein the DC channel is connected in common to the inverted clock signal pins and the reference voltage pins of devices under test that are connected in common to the same input/output signal channel.

7. The system of claim 1, wherein the number of the chip selection channels is dependent on the number of the devices under test which are connected in common to the input/output signal channels.

8. The system of claim 1, further comprising second devices under test which are connected in common to the chip selection channels but not connected in common to the commonly connected input/output signal channels.

9. A method of testing a plurality of devices under test, said devices having an inverted clock signal pin and a reference voltage pin, comprising:

preparing at least two devices under test having input/output signal pins connected in common to an input/output signal channel, said devices having chip selection signal pins connected to respective chip selection signal channels, which provide chip selection signals used to select output data from one of the devices under test, and a DC channel connected in common to said inverted clock signal pin and to said reference voltage pin; and reading through the commonly connected input/output signal channel the output data of the device under test selected by the chip selection signal.

10. The method of claim 9, wherein the preparation step includes directly connecting one of the input/output signal pins to the input/output signal channel and shortening the other pin with the directly connected pin.

11. The method of claim 10, wherein the directly connected pin and the shorted pin are individually included in different devices under test.

12. The method of claim 9, wherein the preparation step further includes commonly connecting a DC channel which supplies DC current to inverted clock signal pins and reference voltage pins of the devices under test.

13. The method of claim 12, wherein the DC channel is connected in common to only the inverted clock signal pins and the reference voltage pins of the devices under test that are connected in common to the input/output signal channel.

14. The method of claim 9, further comprising introducing second devices under test which are connected in common to the chip selection signal channel but not connected in common to the commonly connected input/output signal channel.

15. The method of claim 14, wherein the reading step includes reading via an input/output signal channel different from the commonly connected input/output signal channel output data specified by the chip selection signals, from the second devices under test.

16. The method of claim 9, wherein the chip selection signals enable output data other than the selected output data, among output data connected to the commonly connected input/output signal channel, to a high impedance state, so that only the selected output data are outputted to the commonly connected input/output signal channel.

17. The method of claim 9, further comprising commonly performing a write operation at the devices under test, before the reading step.

18. A method of testing a plurality of devices under test (DUTs) which have input/output pins, inverted clock signal pins, reference voltage pins, and chip selection signal pins using test equipment which includes signal channels, comprising:

connecting in common the input/output signal pins of at least two DUTs and connecting said commonly connected pins to a first channel with is used as an input/output signal channel;

connecting said chip selection signal pins to channels used as chip selection channels, which provides chip selection signals to select output data from one of said DUTs;

connecting a DC channel to said inverted clock signal pins and to said reference voltage pins, and reading through the commonly connected input/output signal channel the output data of the device under test selected by the chip selection channels.

19. A method of testing a plurality of devices under test (DUTs) wherein at least two of said DUTs have input/output signal pins connected in common to an input/output signal channel, said DUTs have chip selection signal pins connected to respective chip selection signal channels which provide chip selection signals used to select output data from one of the devices under test, and a DC channel connected in common to an inverted clock signal pin and a reference voltage pin; said method comprising:

selecting one of said DUTs by a chip selection signal on said chip selection channels, activating said DC channel, and reading through the commonly connected input/output signal channel the output data of the device under test selected by said chip selection signal.

20. The method of claim 19, wherein the input/output signal pins of one DUT is directly connected to the input/output signal channel and the input/output signal pins of a second DUT are shorted the input/output signal pins of the directly connected DUT.

21. The method of claim 19, including commonly connecting a DC channel which supplies DC current to inverted clock signal pins and reference voltage pins of the DUTs.

22. The method of claim 21, wherein the DC channel is connected in common to only the inverted clock signal pins and the reference voltage pins of the DUTs that are connected in common to the input/output signal channel.

23. The method of claim 19, further comprising introducing a second DUT which is connected in common to the chip selection signal channel but not connected in common to the commonly connected input/output signal channel.

24. The method of claim 23, wherein the reading step includes reading via an input/output signal channel different from the commonly connected input/output signal channel output data specified by the chip selection signals, from the second DUT.

25. The method of claim 19, wherein the chip selection signals enable output data other than the selected output data to a high impedance state, so that only the selected output data are outputted to the commonly connected input/output signal channel.

26. The method of claim 19, further comprising commonly performing a write operation to the DUTs, before the reading step.

* * * * *